US007628651B2

(12) United States Patent  
Yeh

(10) Patent No.: US 7,628,651 B2  
(45) Date of Patent: Dec. 8, 2009

(54) ELECTRICAL CONNECTOR HAVING A CONNECTING ASSEMBLY

(75) Inventor: Cheng-Chi Yeh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/286,600

(22) Filed: Sep. 30, 2008

(65) Prior Publication Data

US 2009/0104796 A1 Apr. 23, 2009

(30) Foreign Application Priority Data

Oct. 19, 2007 (CN) .................. 2007 2 0043773.3

(51) Int. Cl.  
*H01R 13/648* (2006.01)

(52) U.S. Cl. .................... 439/607.37; 439/73; 439/331

(58) Field of Classification Search ..............................  
439/607.35–607.38, 71, 73, 331  
See application file for complete search history.

(56) References Cited

U.S. PATENT DOCUMENTS

| 3,552,698 | A  | * | 1/1971  | Kinney ........................ 248/158 |
|-----------|----|---|---------|----------------------------------------|
| 5,221,209 | A  | * | 6/1993  | D'Amico ....................... 439/71 |
| 5,344,334 | A  | * | 9/1994  | Laub et al. ................... 439/331 |
| 5,791,914 | A  | * | 8/1998  | Loranger et al. ............... 439/71 |
| 6,027,345 | A  | * | 2/2000  | McHugh et al. ................ 439/66 |
| 6,196,871 | B1 | * | 3/2001  | Szu ............................ 439/571 |
| 6,692,279 | B1 | * | 2/2004  | Ma ............................. 439/331 |
| 6,776,642 | B1 | * | 8/2004  | McHugh et al. ............... 439/331 |
| 7,008,239 | B1 | * | 3/2006  | Ju .............................. 439/71 |
| 7,160,130 | B2 | * | 1/2007  | Ma ............................. 439/331 |
| 7,182,619 | B2 | * | 2/2007  | Hsu ............................ 439/331 |
| 7,227,761 | B2 | * | 6/2007  | Estes et al. ................... 361/810 |
| 7,232,332 | B2 | * | 6/2007  | Osborn et al. ................ 439/487 |
| 7,241,161 | B2 | * | 7/2007  | Mar ............................ 439/331 |
| 7,278,860 | B2 | * | 10/2007 | Ma ............................. 439/73 |
| 7,291,022 | B2 | * | 11/2007 | Toda et al. .................... 439/73 |
| 7,387,523 | B2 | * | 6/2008  | Hsu ............................ 439/331 |
| 7,402,065 | B1 | * | 7/2008  | Polnyi ......................... 439/331 |
| 7,404,728 | B2 | * | 7/2008  | Mar ............................ 439/331 |
| 7,435,124 | B2 | * | 10/2008 | Ma et al. ...................... 439/331 |
| 7,448,879 | B2 | * | 11/2008 | Jin ............................. 439/71 |
| 7,473,121 | B2 | * | 1/2009  | Fan et al. ..................... 439/342 |
| 7,476,115 | B2 | * | 1/2009  | Zhang et al. .................. 439/331 |
| 7,476,122 | B2 | * | 1/2009  | Zhang .......................... 439/485 |
| 7,497,717 | B2 | * | 3/2009  | Zhang .......................... 439/331 |
| 7,510,403 | B2 | * | 3/2009  | Ma ............................. 439/73 |
| 7,553,178 | B1 | * | 6/2009  | Wertz et al. ................... 439/331 |
| 2004/0132331 | A1 | * | 7/2004 | Osborn et al. ................ 439/485 |
| 2006/0079104 | A1 | * | 4/2006 | Lai ............................. 439/71 |
| 2006/0116007 | A1 | * | 6/2006 | Ma ............................. 439/73 |

(Continued)

*Primary Examiner*—Ross N Gushi  
(74) *Attorney, Agent, or Firm*—Andrew C. Cheng; Wei Te Chung; Ming Chieh Chang

(57) ABSTRACT

An electrical connector (100) mounted on a printed circuit board (1) includes a housing unit (2), an outer shield (4) enclosing the housing unit, and a connecting assembly (5) connecting the outer shield to the printed circuit board. The connecting assembly has a supporting member (51), a conductive member (50) extending through the supporting member and a washer (52). The supporting member has a head (501) and a body (502) surrounded by the supporting member (51). The washer locks with the body and resists against an upper surface of the printed circuit board for grounding.

14 Claims, 6 Drawing Sheets

U.S. PATENT DOCUMENTS

| | | | |
|---|---|---|---|
| 2006/0141840 A1* | 6/2006 | Ma | 439/331 |
| 2007/0155215 A1* | 7/2007 | Hsu | 439/331 |
| 2007/0173081 A1* | 7/2007 | Yu et al. | 439/73 |
| 2008/0081489 A1* | 4/2008 | MacGregor et al. | 439/71 |
| 2008/0153337 A1* | 6/2008 | Jin | 439/331 |
| 2009/0047809 A1* | 2/2009 | Yeh | 439/68 |
| 2009/0104796 A1* | 4/2009 | Yeh | 439/73 |

* cited by examiner

ELECTRICAL CONNECTOR HAVING A CONNECTING ASSEMBLY

BACKGROUND OF THE INVENTION

1. Field of the Invention

The present invention relates to an electrical connector assembly, and particularly to an electrical connector assembly having a connecting assembly for connecting an outer shield to a printed circuit board.

2. Description of Prior Arts

U.S. Patent Application Publication No. 2006/0116007 published on Jun. 1, 2006 discloses an electrical connector for mounting onto a printed circuit board comprising a housing, a plurality of contacts mounted into the housing, a stiffener having a window defined in a centre thereof for receiving the housing and four mounting holes defined at four corners of the stiffener, a clip covering the housing and pivotably engaging with the stiffener and a lever for pressing the clip. The electrical connector further has a plurality of plastic cushions mounted into the mounting holes and corresponding screws extending through the plastic cushions and connecting with the printed circuit board.

However, it is unstable to establish a grounding conductive trace of the stiffener to the printed circuit board by the screws.

Hence, it is desirable to provide an improved land grid array connector to overcome the aforementioned disadvantages.

SUMMARY OF THE INVENTION

An object of the present invention is to provide an electrical connector having an improved connecting assembly effectively connecting an outer shield to a printed circuit board for grounding.

To achieve the above object, an electrical connector mounted on a printed circuit board includes a housing, an outer shield enclosing the housing unit, and a connecting assembly connecting the outer shield to the printed circuit board. The connecting assembly has a supporting member, a conductive member extending through the supporting member and a washer. The supporting member has a head and a body surrounded by the supporting member. The washer locks with the body and resists against an upper surface of the printed circuit board for grounding.

The washer of the connecting assembly locks with the conductive member and is located upon the printed circuit board for effectively establishing a grounding between the outer shield and the printed circuit board.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
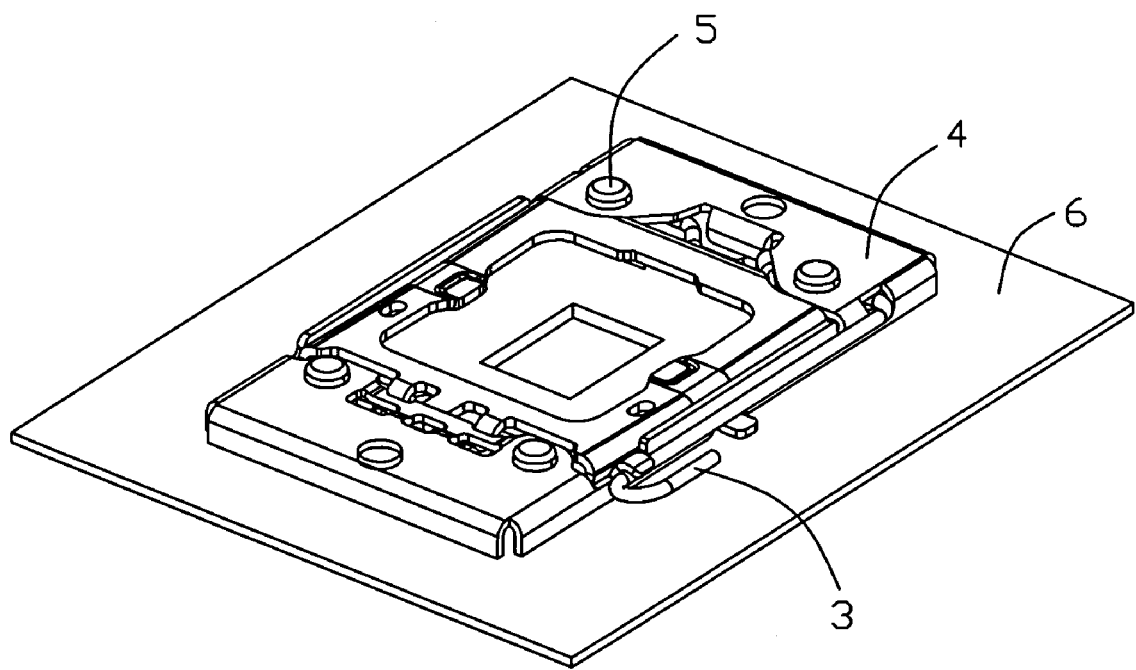
FIG. 1 is an assembled perspective view of an electrical connector of the present invention.
Figure 2:
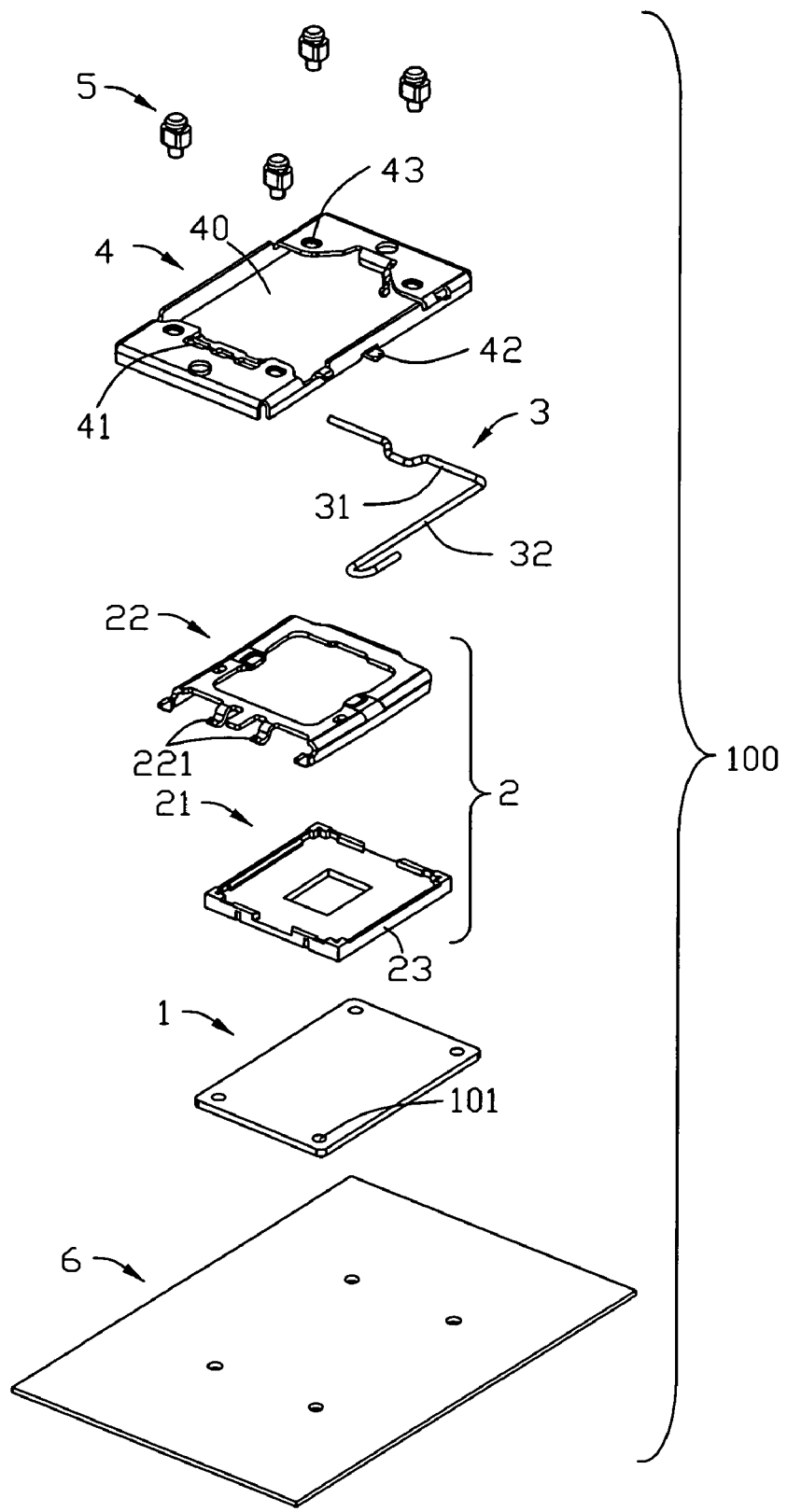
FIG. 2 is an exploded view of the electrical connector as shown in FIG. 1.
Figure 3:
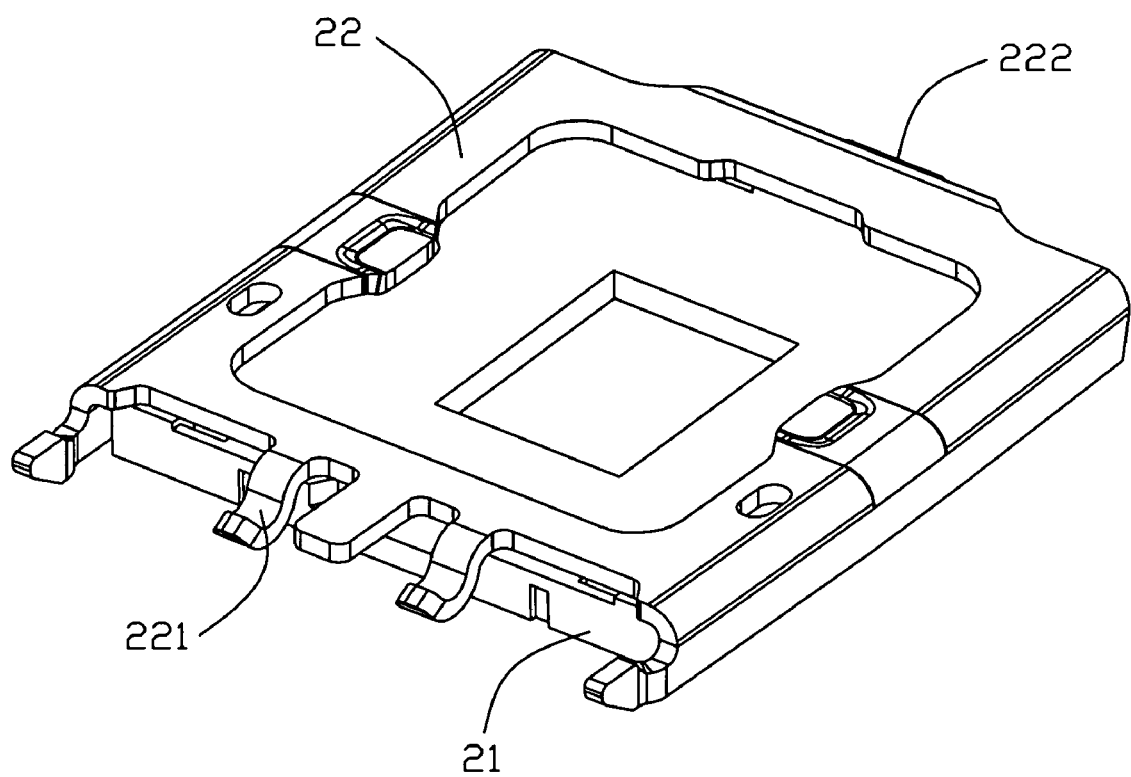
FIG. 3 is an assembled perspective view of a housing unit as shown in FIG. 1.
Figure 4:
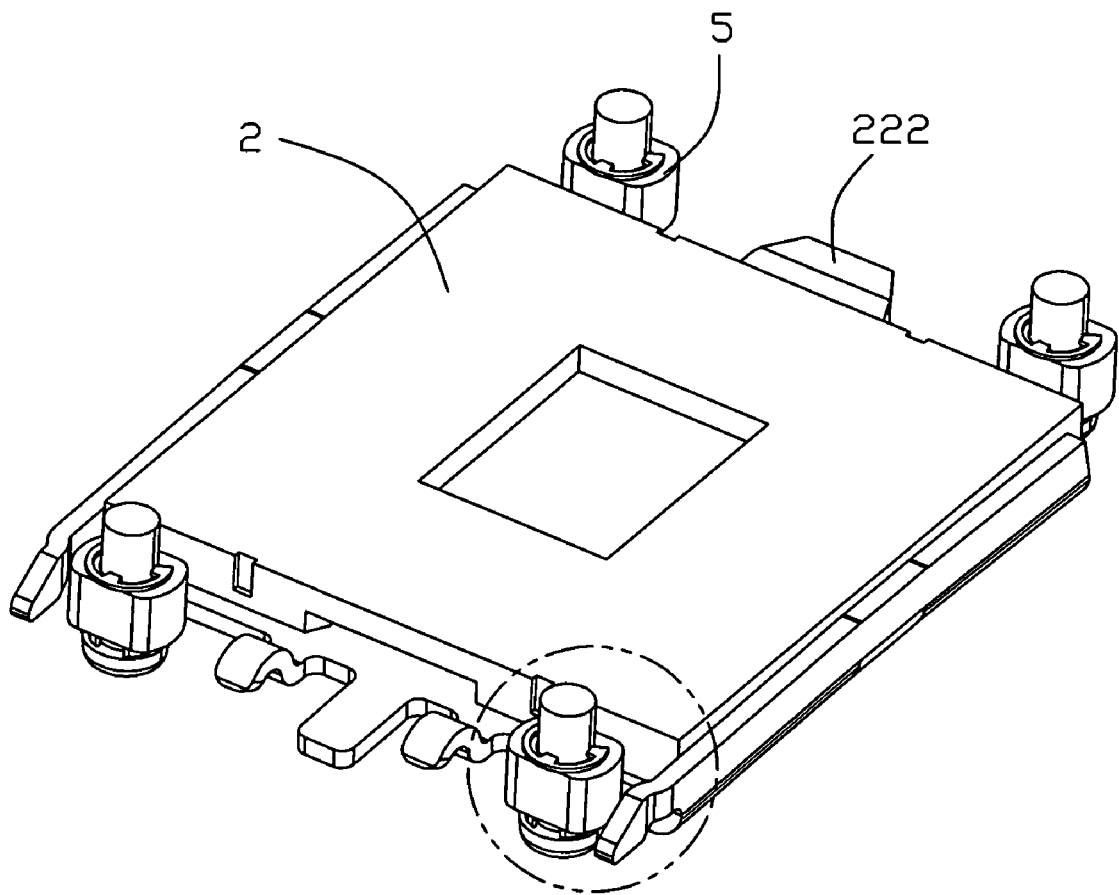
FIG. 4 is a view similar to FIG. 3, taken from another aspect.
Figure 5:
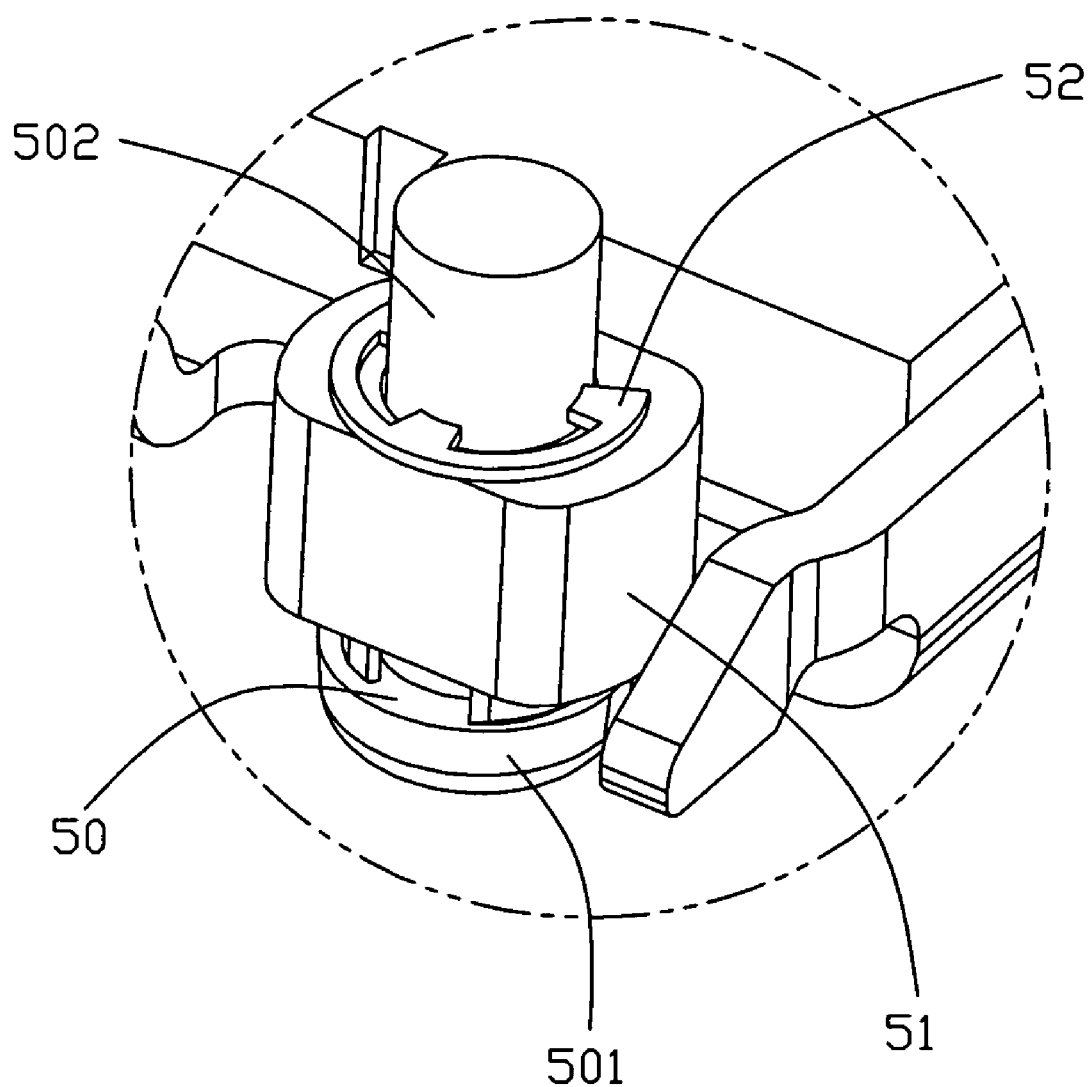
FIG. 5 is a magnifying view of a connecting assembly 5, as especially labeled in FIG. 4.
Figure 6:
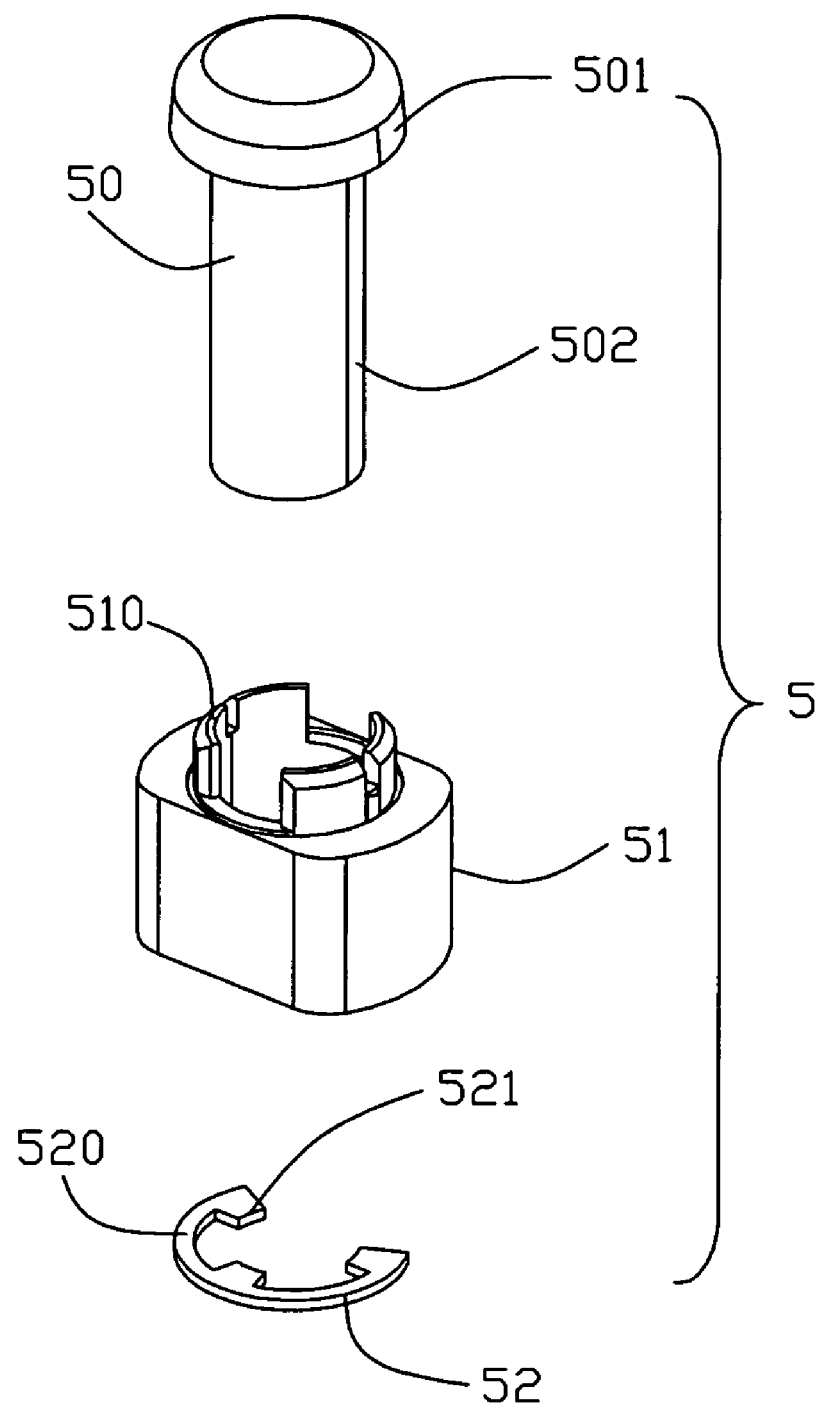
FIG. 6 is an exploded view of a connecting assembly as shown FIG. 1.

Reference will now be made to the drawing figures to describe the present invention in detail. Referring to FIGS. 1-2, an electrical connector 100 mounted to a printed circuit board 1 in accordance with the embodiment of the present invention comprises a housing unit 2, a plurality of contacts (not labeled) mounted into the housing unit 2, an outer shield 4 enclosing the housing unit 2, and a connecting assembly 5 connecting the outer shield 4 to the printed circuit board 1.

The housing unit 2 has a base 21, a stiffener 23 surrounding the base 21 and a clip 22 covering the base 21. The base 21 is of rectangular configuration for receiving the contacts. The clip 22 comprises a plurality of hooks 221 disposed on a lateral side thereof for pivotably engaging with corresponding recesses 41 defined on the outer shield 4 and a projecting section 222 extending from another lateral side of the clip 22.

The electrical connector 100 further comprises a lever 3 coupling with the outer shield 4 for pressing the clip 22. The lever 3 comprises a mating portion 31 rotatably located on the projecting section 222 and an operating portion 32 extending perpendicularly from the mating portion 31 for locking with a latch 42 which projects outwardly form a side of the outer shield 4.

The connecting assembly 5 comprises a conductive member 50 having a head 501 and a body 502, a supporting member 51 having a hole 511 for receiving the body 502 and a washer 52 locking with the body 502 and resisting against an upper surface of the printed circuit board 1 for grounding. The supporting member 51 has a plurality of flanges 510 protruding upwardly therefrom for resisting against a bottom surface of the base 21. The metal washer 52 is an opened loop shaped as an E-ring and has a plurality of latching portions 521 extending inwardly for locking with the body 502 of the conductive member 50.

The outer shield 4 has a window 40 defined in a central portion thereof and in corresponding to the clip 22, a plurality of first mounting holes 43 defined therethrough. The body 502 of conductive member 50 extends through the first mounting holes 43 and second mounting holes 101 defined on the printed circuit board 1 and rivets into a back plate 6 on which the printed circuit board 1 is attached.

In assembly, firstly, the housing unit 2 is located onto a printed circuit board, the mating portion 31 of the lever 3 is rotatably located on the projecting section 222. Secondly, the outer shield 4 is mounted onto the clip 22 of the housing unit 2, and the body 502 of conductive member 50 extends through the first mounting holes 43. The plastic supporting member 51 encloses the body 502, the washer 52 is locked with the body 502 and located between a bottom surface of supporting member and the printed circuit board 1. Finally, the body 502 is riveted into a back plate 6 for locking the outer shield 4 to the printed circuit board 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector mounted on a printed circuit board, comprising:
   a housing unit;
   a plurality of contacts received in the housing unit;
   an outer shield enclosing the housing unit; and
   a connecting assembly connecting the outer shield to the printed circuit board and comprising a supporting member, a conductive member extending through the supporting member and a washer, the conductive member having a head and a body surrounded by the supporting member, the washer locking with the body and resisting against an upper surface of the printed circuit board for grounding.

2. The electrical connector as claimed in claim 1, wherein said washer comprises a C-ring locating between the supporting member and the printed circuit board.

3. The electrical connector as claimed in claim 2, wherein said washer has a plurality of latching portions protruding therefrom for locking with the body of the conductive member.

4. The electrical connector as claimed in claim 1, wherein said outer shield has a plurality of first mounting holes defined in alignment with the a plurality of second mounting holes of the printed circuit board, and wherein the body of conductive member extends through the first mounting hole and the second mounting hole and rivets into a back plate on which the printed circuit board is attached.

5. The electrical connector as claimed in claim 1, wherein said housing unit comprises a base receiving the contacts and a clip over the base.

6. The electrical connector as claimed in claim 5, wherein said outer shield comprises a window defined in a central portion thereof for accommodating the clip.

7. The electrical connector as claimed in claim 5, wherein said outer shield has a plurality of recesses defined thereon, the clip comprises a plurality of hooks pivotably engaging with the recesses.

8. The electrical connector as claimed in claim 5, further comprising a lever coupling with the outer shield for pressing the clip.

9. The electrical connector as claimed in claim 8, wherein said outer shield has a latch extending outwardly therefrom, and wherein the lever comprises a mating portion and an operating portion extending perpendicularly from the mating portion for locking with the latch.

10. The electrical connector as claimed in claim 9, wherein said clip has a projecting section formed on a lateral side thereof, and wherein the mating portion of the lever is rotatably engaging with the projecting section.

11. The electrical connector as claimed in claim 1, wherein said supporting member has a plurality of flanges protruding upwardly therefrom for resisting against a bottom surface of the outer shield.

12. An electrical connector assembly comprising:
    a printed circuit board defining a first through hole;
    a back plate position on an underside of the printed circuit board and defining a second through hole;
    an outer shell positioned on an upper side of the printed circuit board and defining a third through hole;
    a housing unit positioned on the upper side and surrounded by the outer shell;
    a plurality of contacts received in the housing unit;
    a connecting assembly including a conductive member extending through the third through hole, the first through hole and the second through hole for connecting the outer shield to the printed circuit board; wherein
    said connecting assembly further includes a plastic supporting member under the outer shell, through which said conductive member extends under a condition that a metallic washer grasps the conductive member below the supporting member.

13. The assembly as claimed in claim 12, wherein said washer is positioned between the supporting member and the printed circuit board.

14. The assembly as claimed in claim 12, wherein said supporting member includes a plurality of upward flanges received in the corresponding third through hole for avoid the relative transverse movement of the supporting member with regard to the outer shell.

* * * * *